(12) United States Patent
Isobe et al.

(10) Patent No.: US 8,435,892 B2
(45) Date of Patent: May 7, 2013

(54) METHOD OF MANUFACTURING SEMICONDUCTOR DEVICE COMPRISING THE STEP OF DOPING SEMICONDUCTOR FILM THROUGH CONTACT HOLE

(75) Inventors: Atsuo Isobe, Kanagawa (JP); Keiko Saito, Nagano (JP); Tomohiko Sato, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 12/908,521

(22) Filed: Oct. 20, 2010

(65) Prior Publication Data

US 2011/0033990 A1    Feb. 10, 2011

Related U.S. Application Data

(63) Continuation of application No. 11/503,414, filed on Aug. 14, 2006, now abandoned.

(30) Foreign Application Priority Data

Aug. 23, 2005    (JP) ................................. 2005-241734

(51) Int. Cl.
*H01L 21/44*    (2006.01)
(52) U.S. Cl.
USPC ........... 438/675; 438/151; 438/597; 257/288; 257/E21.085
(58) Field of Classification Search .................. 438/151, 438/597, 675; 257/E21.085
See application file for complete search history.

(56) References Cited

U.S. PATENT DOCUMENTS

| | | | |
|---|---|---|---|
| 4,463,492 A | | 8/1984 | Maeguchi |
| 5,292,675 A | | 3/1994 | Codama |
| 5,407,852 A | * | 4/1995 | Ghio et al. ................... 438/130 |
| 5,576,556 A | * | 11/1996 | Takemura et al. .............. 257/69 |
| 5,581,102 A | * | 12/1996 | Kusumoto .................... 257/347 |

(Continued)

FOREIGN PATENT DOCUMENTS

| | | |
|---|---|---|
| JP | 62-274778 | 11/1987 |
| JP | 3-020046 | 1/1991 |

(Continued)

OTHER PUBLICATIONS

Korean Office Action (Application No. 2006-0080126; KR08983) Dated Jul. 19, 2012.

*Primary Examiner* — Robert Huber
(74) *Attorney, Agent, or Firm* — Nixon Peabody LLP; Jeffrey L. Costellia

(57) ABSTRACT

It is an object of an invention disclosed in the present specification to provide a transistor having low contact resistance. In the transistor, a semiconductor film including an impurity element imparting P-type or N-type conductivity, an insulating film formed thereover, and an electrode or a wiring that is electrically connected to the semiconductor film through a contact hole formed at least in the insulating film are included; the semiconductor film has a first range of a concentration of the impurity element ($1 \times 10^{20}$/cm$^3$ or less) that is included in a deeper region than predetermined depth, and a second range of a concentration of the impurity element (more than $1 \times 10^{20}$/cm$^3$) that is included in a shallower region than the predetermined depth; and a deeper region than a portion in contact with the electrode or the wiring in the semiconductor film is in the first range of the concentration of the impurity element.

26 Claims, 12 Drawing Sheets

U.S. PATENT DOCUMENTS

| | | | |
|---|---|---|---|
| 5,763,904 A | 6/1998 | Nakajima et al. | |
| 5,904,509 A | 5/1999 | Zhang et al. | |
| 5,945,710 A | 8/1999 | Oda et al. | |
| 6,008,136 A * | 12/1999 | Wada | 438/723 |
| 6,165,876 A | 12/2000 | Yamazaki et al. | |
| 6,171,961 B1 | 1/2001 | Yamazaki et al. | |
| 6,391,437 B1 * | 5/2002 | Kadomura et al. | 428/307.3 |
| 6,406,952 B2 | 6/2002 | Bevk | |
| 6,436,827 B1 | 8/2002 | Yamazaki et al. | |
| 6,440,828 B1 * | 8/2002 | Sato et al. | 438/533 |
| 6,677,189 B2 * | 1/2004 | Dai et al. | 438/149 |
| 6,878,968 B1 | 4/2005 | Ohnuma | |
| 2002/0197866 A1 | 12/2002 | Yamazaki et al. | |
| 2003/0146458 A1 | 8/2003 | Horiuchi et al. | |
| 2004/0189625 A1 | 9/2004 | Sato | |
| 2005/0253195 A1 | 11/2005 | Toyoda et al. | |
| 2006/0086982 A1 | 4/2006 | Yamazaki et al. | |

FOREIGN PATENT DOCUMENTS

| | | |
|---|---|---|
| JP | 03-022528 | 1/1991 |
| JP | 05-021612 | 1/1993 |
| JP | 09-092716 | 4/1997 |
| JP | 10-098008 | 4/1998 |
| JP | 10-189481 | 7/1998 |
| JP | 2001-257354 | 9/2001 |
| KR | 10-0245368 B1 | 2/2000 |
| KR | 10-0280171 B1 | 2/2001 |

* cited by examiner

METHOD OF MANUFACTURING SEMICONDUCTOR DEVICE COMPRISING THE STEP OF DOPING SEMICONDUCTOR FILM THROUGH CONTACT HOLE

BACKGROUND OF THE INVENTION

1. Field of the Invention

An invention disclosed in the present specification relates to a transistor that is a semiconductor element (for example, a thin film transistor), and a display device using the same or the like. Further, the invention relates to manufacture of the transistor.

2. Description of the Related Art

In a case of manufacturing a thin film transistor, a contact hole is formed into a predetermined shape by performing dry etching with respect to an insulating film to connect a semiconductor film or a conductive film covered with the insulating film such as an interlayer insulating film or a gate insulating film; and a wiring or an electrode (for example, refer to 34 paragraph in Japanese Patent Application Laid-Open No. H10-189481).

Dry etching is not a method where acidic or alkaline liquid is used but a method where gas is used for etching. By dry etching, a pattern having almost the same size as a mask such as a resist mask can be obtained. This etching is referred to as an anisotropic etching and suitable for micro-fabrication.

SUMMARY OF THE INVENTION

When a contact hole is formed, dry etching is performed at a bottom surface of the contact hole on a condition that a semiconductor film or a conductive film in contact with a lower part of (just under) the insulating film is slightly etched. As a result, the insulating film can be completely removed. However, it is not intended that the semiconductor film or the conductive film be excessively etched so as to have a thickness of less than half a thickness before etching or to disappear. By performing etching more deeply than a thickness of an etching object (corresponding to an insulating film in the present specification), a film in contact with a lower part of the etching object, a substrate, or the like are etched. Such etching is referred to as overetching.

In a case where the semiconductor film or the conductive film disappears at the bottom surface of the contact hole, there is a problem that contact resistance is extremely high even if a wiring or an electrode is formed in the contact hole, and therefore, a transistor to be manufactured does not normally operate. The thinner film thickness of the semiconductor film or the conductive film just before forming the contact hole is formed, the more serious this problem becomes.

If the semiconductor film or the conductive film completely disappears at the bottom surface of the contact hole, the wiring or the electrode that is formed later in the contact hole is in contacted with only side faces of the semiconductor film or the conductive film. A semiconductor film in which a source region or a drain region of a thin film transistor is formed has generally a thickness of 100 nm or less. For example, in a case of a thin semiconductor film having a thickness of 30 to 40 nm, a contact area of the wiring or the electrode and the semiconductor film is extremely small, and high contact resistance is caused.

In order to solve the problem, excessive etching that is not intended is attempted to be prevented by modifying a condition in dry etching; however, it is difficult to obtain an appropriate condition.

By investigating a case of generating the excessive etching, it is found that excessive etching is generated in a case where an impurity element imparting predetermined conductivity such as phosphorus with a high concentration is included in a semiconductor film of a transistor. In addition, it is also found that etching depth of the semiconductor film is changed depending on a doping condition that concentration distribution of the impurity element in the semiconductor film is changed.

It is known that depth-direction distribution of a concentration of the impurity element is changed when changing an accelerating voltage that is one of the conditions in doping of the impurity element. By increasing an accelerating voltage, a maximum value of a concentration of the impurity element usually occurs in a further deep portion in the depth-direction distribution of the concentration of the impurity element. It should be noted that an etching rate of the semiconductor film is changed due to a concentration of the impurity element imparting predetermined conductivity included in the semiconductor film. An etching rate can be determined by dividing an etched thickness or depth of an etching object by etching time.

As a gas used for dry etching in order to form a contact hole in an insulating film that is formed over a semiconductor film, $CHF_3$, $CF_4$, or the like (in addition, a rare gas such as helium or argon may be included) can be given, which selectively etches the insulating film. By using the gas, an etching rate with respect to the insulating film becomes higher than an etching rate with respect to the semiconductor film; however, it is not suggested that the semiconductor film be not etched at all. A ratio of an etching rate "a" of an etching object and an etching rate "b" of a material in contact with a lower part of the etching object (for example, corresponding to a semiconductor film in the present specification), that is a/b, is referred to as etching selectivity. It is to be noted that each "a" and "b" is a positive number.

According to an invention disclosed in the present specification, a semiconductor film including an impurity element imparting P-type or N-type conductivity, an insulating film formed over the semiconductor film, and an electrode or a wiring that is electrically connected to the semiconductor film through a contact hole formed at least in the insulating film are included; the semiconductor film has a first range of a concentration of the impurity element that is included in a deeper region than predetermined depth, and a second range of a concentration of the impurity element that is included in a shallower region than the predetermined depth, which has a higher concentration than the first range; and a deeper region (a first region) than a portion in contact with the electrode or the wiring (a bottom surface of the contact hole) in the semiconductor film is in the first range of the concentration of the impurity element. For example, the first range is set to be $1 \times 10^{20}/cm^3$ or less, and the second range is set to be more than $1 \times 10^{20}/cm^3$ and $1 \times 10^{21}/cm^3$ or less. The semiconductor film is used as a source, drain, or gate electrode or the like of a transistor.

According to another invention disclosed in the present specification, a source region and a drain region including an impurity element imparting P-type or N-type conductivity, an insulating film over the source region and the drain region, and an electrode or a wiring that is electrically connected to one of the source region and the drain region through a contact hole formed at least in the insulating film are included; the source region and the drain region have a first range of a concentration of the impurity element that is included in a deeper region than the predetermined depth, and a second range of a concentration of the impurity element that is included in a shallower region than the predetermined depth, which has a higher concentration than the first range; and a deeper region (a first region) than a portion in contact with the electrode or the wiring (a bottom surface of the contact hole) in one of the source region and the drain region is in the first range of the concentration of the impurity element. For example, the first range is set to be $1 \times 10^{20}/cm^3$ or less, and the second range is set to be more than $1 \times 10^{20}/cm^3$ and $1 \times 10^{21}/cm^3$ or less. The source region and the drain region are formed by implementing the impurity element in a region of part of a semiconductor film.

A thickness of the first region is thinner than a thickness of a second region of the semiconductor film (or one of the source region and the drain region) except for the first region (for example, thinner by 1 nm or more), and 50% of a thickness of the second region, preferably 60%, and more preferably 65% as a lower limit. This is so that the insulating film in a bottom surface of the contact hole does not remain and contact resistance between the semiconductor film and the electrode or the wiring is not increased. Even if the semiconductor film has a thickness of 45 nm or less, of which a lower limit is a thickness of 30 nm, the semiconductor film in the bottom surface of the contact hole does not disappear.

As the predetermined depth, depth of 1 nm or more is needed. The predetermined depth is set to be 50% or less of a thickness of the second region in the semiconductor film, preferably 40% or less, and more preferably 35% or less. In the present specification, depth refers to a value measured on condition that an arbitral position on a surface of an object (a semiconductor film, a source region, a drain region, or the like), which is not overetched, is made to be a base, in other words, depth of 0 nm.

As the semiconductor film, a film containing silicon as its main component, a film containing silicon and germanium, or the like can be used. The semiconductor film may contain hydrogen. Further, the semiconductor film may be any one of a polycrystalline semiconductor film, a single crystal semiconductor film, a microcrystalline semiconductor film, and an amorphous semiconductor film. Instead of the semiconductor film, a single crystal or polycrystalline semiconductor substrate, typically, a silicon substrate, may be used to manufacture an electric-field effect transistor by applying an invention disclosed in the present specification. In this case, depth of a source region (a drain region) formed in the semiconductor substrate corresponds to a thickness of the semiconductor film.

In a case where the impurity element has N-type conductivity, the impurity element is typically phosphorus; however, another impurity element such as arsenic may be used. In a case where the impurity element has P-type conductivity, the impurity element is typically boron; however, another impurity element may be used.

Even if a semiconductor film is thin, the semiconductor film can be made not to disappear in a bottom surface of a contact hole. In addition, the semiconductor film in the bottom surface of the contact hole can be made to leave a thickness corresponding to 50% or more of a thickness of a portion where the contact hole is not formed. Therefore, increase in contact resistance between the semiconductor film and a wiring or an electrode, which are connected through the contact hole, can be suppressed.

In a case where a contact hole is formed by dry etching of an insulating film, overetching can be stopped at desired depth. Therefore, a transistor without a contact defect can be obtained, in which an insulating film is completely removed in a bottom surface of the contact hole.

DETAILED DESCRIPTION OF THE INVENTION

Embodiment Mode 1

An example of manufacturing a thin film transistor (hereinafter, referred to as a TFT in the present specification) will be explained below.

Figure 1A:
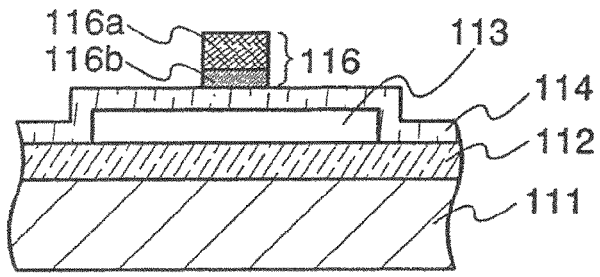
FIGS. 1A to 1D show cross-sectional views for showing a process of manufacturing a TFT.

As shown in FIG. 1A, a base insulating film 112 having a thickness of 100 to 300 nm is formed over a substrate 111. As the substrate 111, an insulating substrate such as a glass substrate, a quartz substrate, a plastic substrate, or a ceramic substrate, a metal substrate, a semiconductor substrate, or the like can be used.

In the base insulating film 112, a single-layer structure of an insulating film containing oxygen or nitrogen such as silicon oxide ($SiO_x$), silicon nitride ($SiN_x$), silicon oxide containing nitrogen ($SiO_xN_y$) (x>y>0) (also referred to as silicon oxynitride), or silicon nitride containing oxygen ($SiN_xO_y$) (x>y>0) (also referred to as silicon nitride oxide); or a stacked-layer structure of these insulating films can be used. In particular, when there is a problem that an impurity such as an alkali metal included in the substrate 111 or contaminant attached to the substrate 111 is dispersed, the base insulating film 112 is preferably formed.

When a glass substrate is used as the substrate 111, a surface of the glass substrate may be directly subjected to plasma treatment by using plasma, which is excited by a microwave and has a high electron density and a low electron temperature, on the condition that an electron temperature is 0.5 eV or more and 1.5 eV or less, an ion energy is 5 eV or less, and an electron density is $1 \times 10^{11}/cm^3$ or more and $1 \times 10^{13}/cm^3$ or less. The plasma can be generated by using a plasma treatment device for microwave excitation with the use of a radial slot antenna. At this time, by introducing a nitride gas such as nitrogen ($N_2$), ammonia ($NH_3$), or nitrous oxide (N$_2$O), the surface of the glass substrate can be nitride. A nitride layer formed over the surface of the glass substrate contains silicon nitride as its main component; therefore, the nitride layer can be used as a blocking layer to an impurity dispersing from the glass substrate. A silicon oxide film or a silicon oxide film containing nitrogen may be formed over this nitride layer by a plasma CVD method to be the base insulating film 112.

In addition, a surface of the base insulating film 112 formed of silicon oxide or silicon oxide containing nitrogen is subjected to the above plasma treatment, and then nitriding treatment can be performed to the surface and a portion having depth of 1 to 10 nm from the surface. This extremely thin nitride layer allows the base insulating film 112 be a blocking layer without affecting stress to a semiconductor film formed over the base insulating film 112 later.

The base insulating film 112 in contact with a lower part of the semiconductor film is preferably formed to be a silicon nitride film or a silicon nitride film containing oxygen having a film thickness of 0.01 to 10 nm, preferably 1 to 5 nm. When a metal element is used for a crystallization method with respect to the semiconductor film, the metal element is needed to be gettered. At this time, when the base insulating film 112 is a silicon oxide film, a metal element in the semiconductor film and oxygen in the silicon oxide film react to be metal oxide in an interface between the silicon oxide film and the semiconductor film, and then the metal element may be difficult to be gettered. Therefore, the silicon oxide film is not preferably used in a portion of the base insulating film 112 in contact with the semiconductor film.

Subsequently, in this embodiment mode, a film containing silicon as its main component is formed to have a film thickness of 60 to 70 nm as the semiconductor film. As the semiconductor film, a crystalline semiconductor film can be used. The crystalline semiconductor film is formed by forming an amorphous semiconductor film or a microcrystalline semiconductor film by a CVD method, and crystallizing the film by a laser crystallization method using an excimer laser or the like. The microcrystalline semiconductor film can be obtained by glow discharge decomposition of a gas made from a compound of silicon such as SiH$_4$. The microcrystalline semiconductor film can be easily formed by using a diluted gas made from a compound of silicon. Since the semiconductor film formed by a CVD method contains large amount of hydrogen, heat treatment for dehydrogenation is performed as needed before crystallization. In a case of performing laser crystallization, heat treatment for dehydrogenation is preferably performed in advance. Instead of the crystalline semiconductor film, an amorphous semiconductor film may be used.

Further, as a crystallization technique, a rapid thermal annealing method (RTA method) using a halogen lamp or a technique of crystallization using a heating furnace can be applied. In addition, a method for solid-phase growth of an amorphous semiconductor film by using a metal element such as nickel as a crystalline nucleus.

A film containing silicon as its main component is formed to have a predetermined shape through a photolithography process. In this embodiment mode, the predetermined shape indicates an island-shape. An island-shape film 113 containing silicon as its main component is formed. Boron (B) as an impurity element may be added to the island-shape film 113 containing silicon as its main component. In this case, a concentration of boron in the island-shape film 113 containing silicon as its main component is set to be $1\times10^{15}$ to $1\times10^{18}$/cm$^3$ (preferably, $1\times10^{16}$ to $5\times10^{17}$/cm$^3$).

A first insulating film 114 is formed by a CVD method or a sputtering method to have a thickness of 5 to 50 nm so as to cover the island-shape film 113 containing silicon as its main component. The first insulating film 114 is in contact with the island-shape film 113 containing silicon as its main component, and serves as a gate insulating film.

The first insulating film 114 may have a stacked-layer structure by appropriately combining any of silicon oxide (SiO$_x$), silicon nitride (SiN$_x$), silicon oxide containing nitrogen (SiO$_x$N$_y$) (x>y>0), and silicon nitride containing oxygen (SiN$_x$O$_y$) (x>y>0). In this embodiment mode, the insulating film 114 has a stacked-layer structure of a SiN$_x$O$_y$ film and a SiO$_x$N$_y$ film. A surface of the first insulating film 114 may be densified with oxidation or nitriding treatment by the above plasma having the high electron density and low electron temperature. This treatment may be performed preceding formation of the first insulating film 114. In other words, plasma treatment is performed with respect to the surface of the island-shape film 113 containing silicon as its main component. At this time, plasma treatment is performed at a substrate temperature of 300° C. to 450° C. under an oxidative atmosphere (such as O$_2$ or N$_2$O) or a nitriding atmosphere (such as N$_2$ or NH$_3$) so that an interface between the island-shape film 113 containing silicon as its main component and an insulating film deposited thereover can be favorably formed.

Subsequently, a conductive film that is to be a gate electrode is formed over the first insulating film 114. As the conductive film, any one of an aluminum (Al) film, a copper (Cu) film, a film containing aluminum or copper as its main component, a chromium (Cr) film, a tantalum (Ta) film, a tantalum nitride (TaN$_x$) (x>0) film, a titanium (Ti) film, a tungsten (W) film, a tungsten nitride (WN$_x$) (x>0) film, and a molybdenum (Mo) film; or a stacked-layer film of any two or more kinds of the above films, for example, a stacked layer of an Al film and a Ta film, a stacked layer of an Al film and a Ti film, or a stacked layer of a TaN$_x$ film and a W film, can be used. In this embodiment mode, as the conductive film, a stacked-layer film of tantalum nitride (TaN$_x$) of about 30 nm and tungsten (W) of about 370 nm is used.

Then, an electrode 116 having a predetermined shape is formed of the conductive film through the photolithography process (FIG. 1A). In this embodiment mode, first etching is selectively performed with respect to tungsten (W) of a stacked-layer film forming the conductive film. In this case, etching is preferably performed on a condition of high etching selectivity of tungsten (W) with respect to tantalum nitride (TaN$_x$) so as not to etch tantalum nitride (TaN$_x$). An example of a condition of the first etching is as follows: a mixed gas of CF$_4$, Cl$_2$, and O$_2$ is used; a mixed ratio is set to be CF$_4$/Cl$_2$/O$_2$=60 sccm/50 sccm/45 sccm; electric power of 2000 W is supplied to a coiled electrode with pressure of 0.67 Pa to generate plasma; electric power of 150 W is applied to a substrate side (a sample stage); and a temperature of the sample stage is set to be −10° C.

As a resist mask used for the photolithography process, one having a perpendicular shape can be used. After performing the first etching, the resist mask is peeled to be found that a reaction product due to the etching is attached to a side wall of a pattern 116a of the obtained tungsten (W). The reaction product is removed by being soaked in a drug solution (name of commodity: SPR301) containing oxalic acid as its main component at 60° C. for 10 minutes.

Subsequently, by using the pattern 116a of tungsten (W) as a mask, second etching is selectively performed with respect to tantalum nitride (TaN$_x$) (x>0). At this time, etching is preferably performed on a condition of high etching selectivity of tantalum nitride (TaN$_x$) and the first insulating film 114 so as not to etch the first insulating film 114. In addition, the etching is also performed on a condition of high etching selectivity of tantalum nitride (TaN$_x$) and tungsten (W) so as not to etch tungsten (W). An example of the second etching condition is as follows: a Cl$_2$ gas is used; electric power of 1000 W is supplied to a coiled electrode with pressure of 2.00 Pa to generate plasma; electric power of 50 W is applied to the substrate side (the sample stage); and a temperature of the sample stage is set to be −10° C.

By second etching, a pattern 116*b* of tantalum nitride (TaN$_x$) is obtained, and then the electrode 116 having approximately perpendicular shape is formed by combining the pattern 116*b* and the pattern 116*a* of tungsten (W). This electrode 116 serves as a gate electrode or a gate wiring. In a case where a sidewall is not formed later, a shape of the electrode 116 is not limited to the perpendicular shape. One or both of the pattern 116*a* of tungsten (W) and the pattern 116*b* of tantalum nitride (TaN$_x$) may be formed to have a taper shape.

Dry etching is used as etching in this embodiment mode. The etching can be performed by using an ICP (Inductively Coupled Plasma) etching method.

Figure 1B:
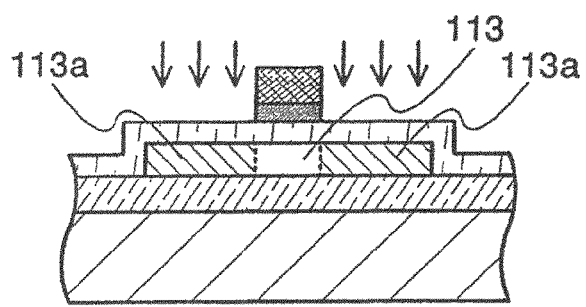

Next, the island-shape film 113 containing silicon as its main component is doped with an impurity element imparting P-type or N-type conductivity (FIG. 1B). In this embodiment mode, phosphorus (P) that is an impurity element imparting N-type conductivity is added to the island-shape film 113 containing silicon as its main component through the first insulating film 114; therefore, a low concentration impurity region 113*a* is formed. A concentration of an impurity element imparting N-type conductivity in the low concentration impurity region 113*a* is set to be $1\times10^{15}$ to $1\times10^{18}$/cm$^3$ (preferably, $1\times10^{16}$ to $5\times10^{17}$/cm$^3$). As a doping method of an impurity element, an ion doping method or an ion implanting method can be used. Instead of phosphorus, arsenic (As) may be used.

Then, a second insulating film is formed to cover the first insulating film 114 and the electrode 116. In this embodiment mode, the second insulating film is formed by forming a silicon oxide film containing nitrogen (SiO$_x$N$_y$) (x>y>0) with a thickness of about 100 nm by a plasma CVD method, and then forming a silicon oxide film (SiO$_x$) (x>0) with a thickness of about 200 nm by a thermal CVD method.

Figure 1C:
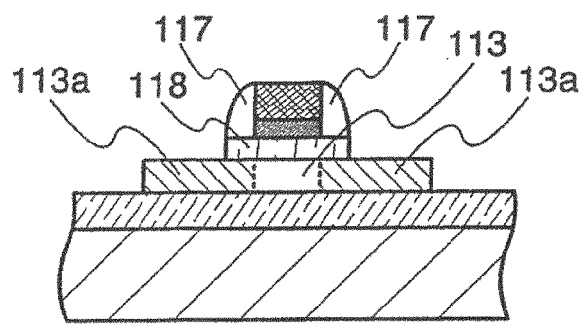

Next, the second insulating film is selectively etched by anisotropic etching mainly in a perpendicular direction to form insulators 117 in contact with side surfaces of the electrode 116 (FIG. 1C). In a process of forming the insulators 117, a top surface of the electrode 116 is exposed. However, in a case where an insulating film used as a mask is funned over the electrode 116, the top surface of the electrode 116 may not be exposed. The insulators 117 on the side surfaces of the electrode 116 become a sidewall, which can be formed to have width of 10 to 300 nm.

These insulators 117 are formed so as to provide both of the low concentration impurity region 113*a* and a high concentration impurity region described below in the island-shape film 113 containing silicon as its main component. This insulators 117 are not always needed to be formed, but may be formed as needed. In a case where the low concentration impurity region 113*a* is not formed, the insulator 117 is not needed.

By the process of forming the insulators 117, part of the first insulating film 114 is also removed to be an insulating film 118 as shown in FIG. 1C, and then part of the island-shape film 113 containing silicon as its main component (part of the low concentration impurity region 113*a*) is exposed.

This exposed portion is to be a source region and a drain region afterwards. The insulating film 118 serves as a gate insulating film. In a case where etching selectivity of the first insulating film 114 and the low concentration impurity region 113*a* is low, the low concentration impurity region 113*a* that is the exposed position has a thin film thickness due to overetching.

Figure 1D:
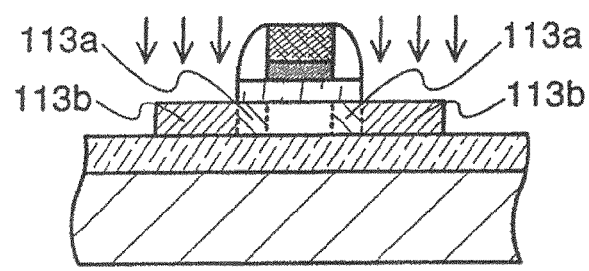

Thereafter, as shown in FIG. 1D, the island-shape film 113 containing silicon as its main component (the low concentration impurity region 113*a*) is doped with an impurity element imparting P-type or N-type conductivity by using the electrode 116, the insulators 117, and the insulating film 118 as a mask to form high concentration impurity region 113*b*. This high concentration impurity region 113*b* corresponds to a source region and a drain region. In this embodiment mode, phosphorus is used as the impurity element.

Figure 2:
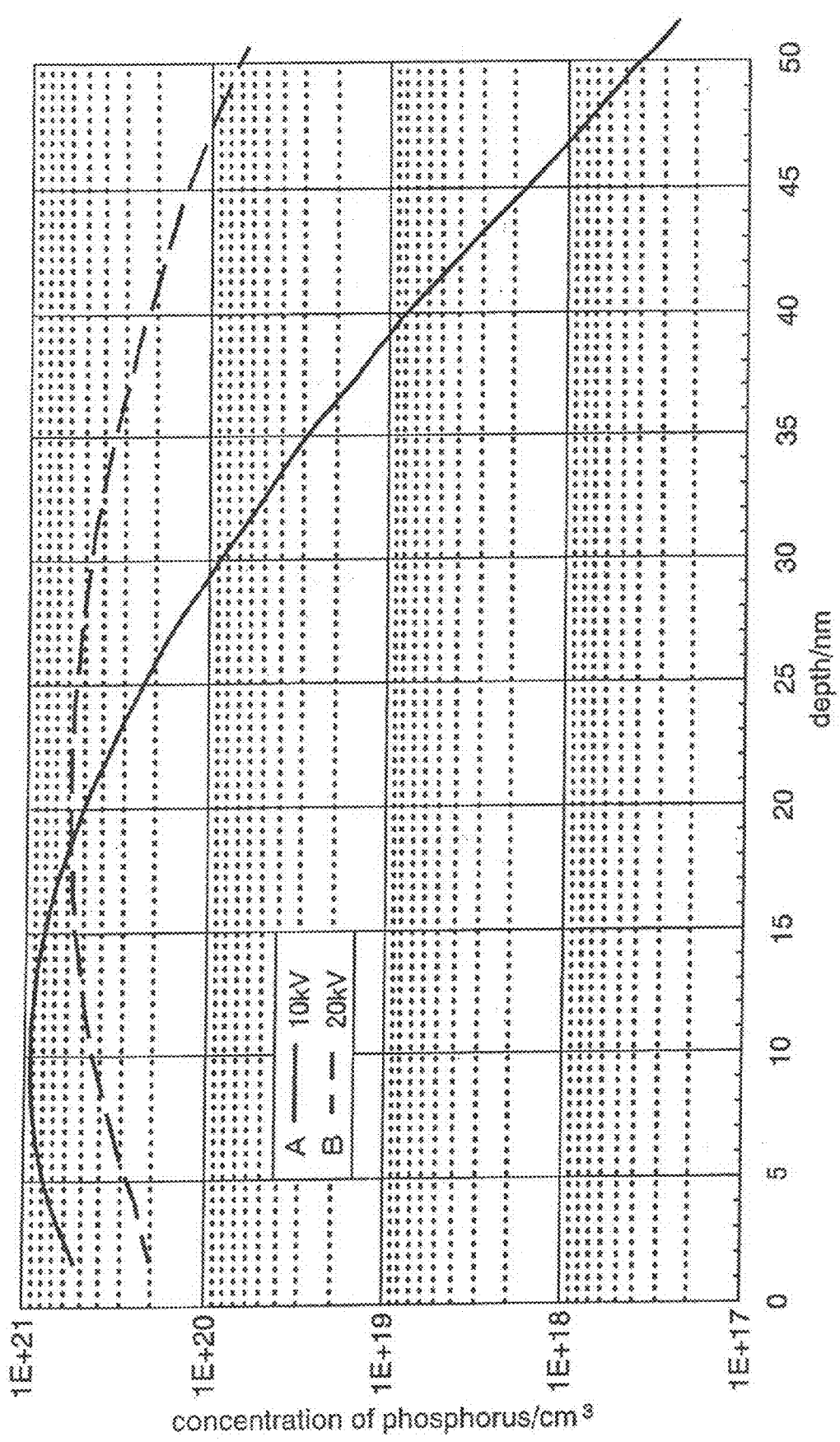
FIG. 2 shows a graph for showing concentration distribution in a depth direction of phosphorus.

FIG. 2 shows concentration distribution (a depth profile) in a depth direction of phosphorus in silicon, where a horizontal axis indicates depth from a silicon surface that is doped, and a vertical axis indicates a concentration of phosphorus. In order to obtain concentration distribution of FIG. 2, there are two doping conditions. One condition (hereinafter, referred to as a "condition A" in the present specification) is as follows: a using gas is one diluting PH$_3$ (phosphine) to have a concentration of 5%; a gas flow rate is 40 sccm; an accelerating voltage is 10 kV; a current density is 5.0 µA; and dose amount is $3.0\times10^{15}$/cm$^2$. The other condition (hereinafter, referred to as a "condition B" in the present specification) is as follows: a using gas is one diluting PH$_3$ (phosphine) to have a concentration of 5%; a gas flow rate is 40 sccm; an accelerating voltage is 20 kV; a current density is 5.0 µA; and dose amount is $3.0\times10^{15}$/cm$^2$.

In FIG. 2, the "condition A" in which an accelerating voltage is 10 kV is indicated by a solid line, and the "condition B" in which an accelerating voltage is 20 kV is indicated by a broken line. When the depth becomes deeper than 20 nm, a concentration of phosphorus in the "condition A" is remarkably reduced more than that in the "condition B". In the "condition A", a region of which depth is deeper than 30 nm has a concentration of phosphorus of $1\times10^{20}$/cm$^3$ or less. On the other hand, in the "condition B", a region of which depth is shallower than 45 nm has a concentration of phosphorus of more than $1\times10^{20}$/cm$^3$.

In this embodiment mode, as a doping condition of phosphorus for forming the high concentration impurity region 113*b*, the "condition A" in which an accelerating voltage is 10 kV is adopted.

Then, the impurity element subjected to doping is activated by performing heat treatment or the like. Activation may be performed after forming an interlayer insulating film 120 having a single-layer structure described below or after forming a first layer or a second layer of the interlayer insulating film 120 having a stacked-layer structure. As a method for activation, irradiation of laser light, RTA, heat treatment using a furnace at 550° C. or less for four hours or less, or the like can be used. It is to be noted that this activation is needed to be performed on a condition that concentration distribution in the depth direction of phosphorus contained in the high concentration impurity region 113*b* is not uniformed.

Figure 3A:
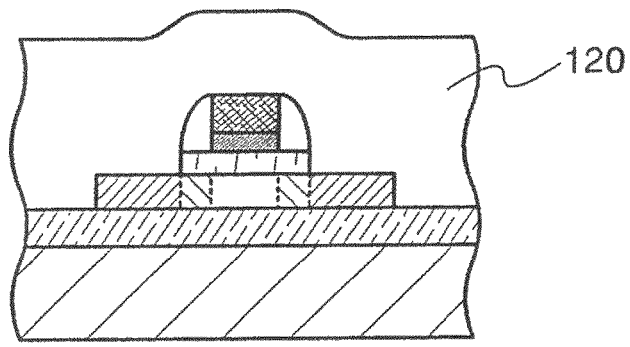
FIGS. 3A to 3C show cross-sectional views for showing a process of manufacturing a TFT.

The interlayer insulating film 120 with a thickness of 600 nm or more is formed to cover at least the high concentration impurity region 113*b* that is part of the island-shape film 113 containing silicon as its main component and the electrode 116 (FIG. 3A). The interlayer insulating film 120 is formed using an organic material or an inorganic material. The interlayer insulating film 120 may have a single-layer structure or a stacked-layer structure having two-layer or three-layer. In this embodiment mode, a stacked-layer structure having three-layer with a silicon nitride film interposed between silicon oxide films containing nitrogen ($SiO_xN_y$) (x>y>0) is used for the interlayer insulating film 120.

Figure 3B:
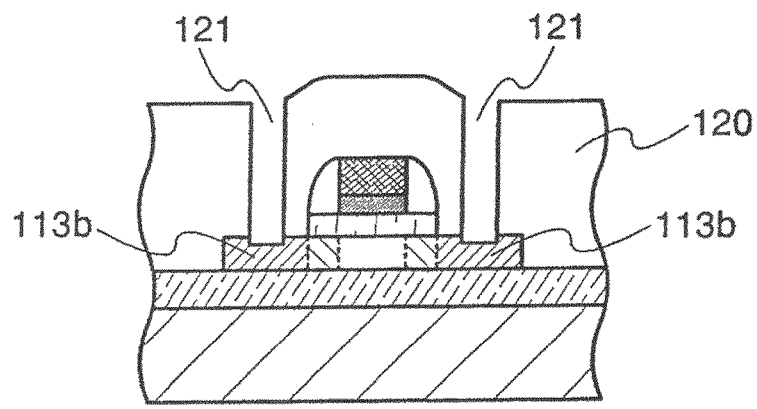

In the interlayer insulating film 120, a contact hole 121 for exposing at least part of the high concentration impurity region 113b are formed by dry etching (FIG. 3B). At the same time as forming the contact hole 121, a contact hole for exposing at least part of the electrode 116, which is not illustrated, may be formed in the interlayer insulating film 120. However, it should be noted that depth of overetching with respect to the electrode 116 is concerned.

In this embodiment mode, dry etching for forming the contact hole 121 is performed through three steps. A gas used for dry etching in this embodiment mode is a mixed gas of helium (He) and $CHF_3$; however, a mixed ratio of the gas in each step is different. In a first step, a mixed ratio is set to be $CHF_3$/He=50 sccm/100 sccm, and plasma is generated with pressure of 5.5 Pa. In a second step, a mixed ratio is set to be $CHF_3$/He=7.5 sccm/142.5 sccm, and the interlayer insulating film 120 is etched so as to have a remaining film thickness of about 200 nm with the same pressure as that of the first step. In a third step, a mixed ratio is set to be $CHF_3$/He=48 sccm/152 sccm in order to adopt a condition of high etching selectivity of the interlayer insulating film 120 and the high concentration impurity region 113b, and the contact hole 121 is finally formed with the same pressure as that of the first step and the second step.

In this embodiment mode, a time required for the third step is set to be longer than that of the first step and the second step, and overetching is performed in the third step. Hereinafter, the above three steps are referred to as a "condition C" in the present specification. As a gas used for this "condition C", another gas $C_xF_y$ (X and Y are positive integer number) instead of $CHF_3$, for example, $CF_4$ can be used, and another rare gas instead of helium, for example, argon (Ar) can be used.

Figure 3C:
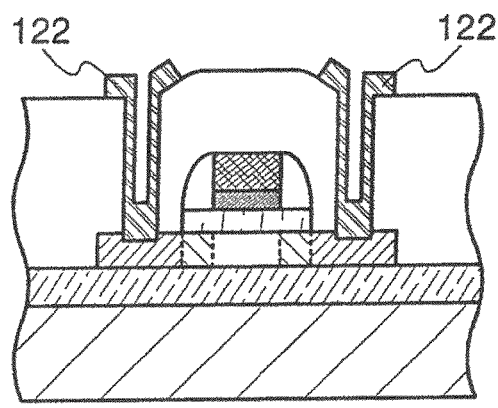

Subsequently, a conductive layer having a stacked-layer structure of a layer containing titanium (Ti) as its main component and a layer containing aluminum (Al) as its main component thereover is formed in the contact hole 121 by a sputtering method so that wiring or electrodes 122 are formed through a photolithography process (FIG. 3C). In such a manner, a TFT is manufactured. Instead of titanium, a metal such as copper (Cu), molybdenum (Mo), tantalum (Ta), or tungsten (W), which has higher melting point than aluminum, can be used. In addition, the stacked-layer structure may include conductive metal nitride and be formed without using the layer containing aluminum as its main component. The wiring or the electrode 122 is electrically connected to the high concentration impurity region 113b. In a case where the contact hole, which is not illustrated, for exposing at least part of the electrode 116 is formed, a wiring that is electrically connected to the electrode 116 is formed by concurrently forming the above conductive layer in the contact hole.

Figure 4A:
FIGS. 4A and 4B show a photograph of a cross-section of a contact portion and a graph for showing contact chain resistance.

FIG. 4A shows a cross-section of a portion in which the high concentration impurity region 113b that is formed by doping the film containing silicon as its main component with phosphorus on the "condition A" and the wiring or the electrode 122 are connected through the contact hole formed on the "condition C" in the interlayer insulating film 120, which is observed by an electron microscope. As a result of overetching in forming the contact hole, the high concentration impurity region 113b has a thickness of about 40 nm in a first region that is a deeper portion than a portion in contact with the wiring or the electrode 122 (a bottom surface of the contact hole). The high concentration impurity region 113b has a thickness of about 62 nm in a second region except for the first region. Therefore, the high concentration impurity region 113b is overetched to depth of about 22 nm. This depth of about 22 nm by overetching of the high concentration impurity region 113b corresponds to 40% or less of the above thickness of about 62 nm of the high concentration impurity region 113b. Sheet resistance of the high concentration impurity region 113b is 320 to 340Ω/square.

Figure 4B:
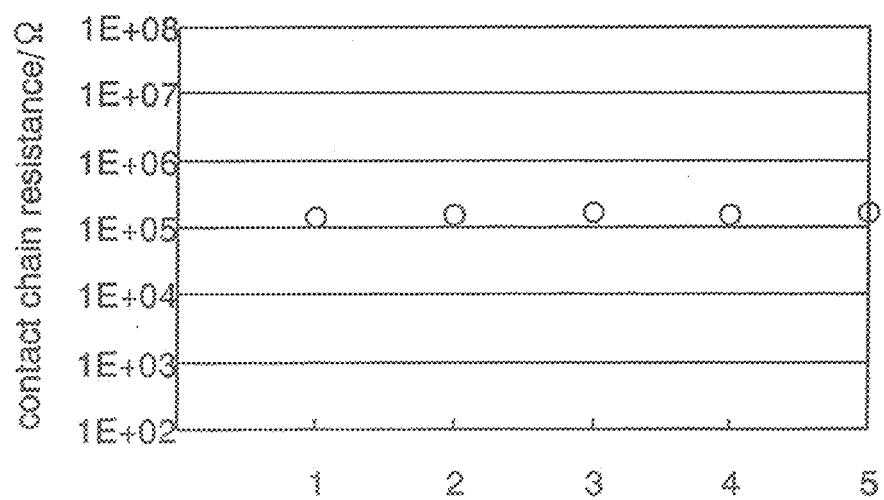

FIG. 4B shows a measurement result of contact chain resistance of an element that has a contact structure of the film containing silicon as its main component doped with phosphorus on the "condition A" and a wiring or an electrode having a stacked-layer structure made of the same material as the wiring or the electrode 122. In the present specification, the contact chain resistance refers to a resistance value of an element (contact chain) in which 1000 pieces of contact structures of a conductor and a semiconductor, conductors, or semiconductors are connected in series. Accordingly, a one-1000th of a value of contact chain resistance as shown in FIG. 4B corresponds to resistance of a piece of a contact chain of the film containing silicon as its main component doped with phosphorus on the "condition A" and the wiring or the electrode, which is calculated to be 140Ω or more and 170Ω or less. This result shows low resistance and small variation. In FIG. 4B, a horizontal axis indicates substrates each having a contact chain, which are different from each other, and a vertical axis indicates a measurement result of contact chain resistance in plural portions with respect to the contact chains each of which is formed over the substrate.

By referring to FIG. 2, concentration distribution of phosphorus contained in the high concentration impurity region 113b as shown in FIG. 4A is estimated as flows; a concentration of phosphorus in a region of which depth from a surface not overetched is up to 22 nm (a shallower region than depth of 22 nm) is $4\times10^{20}/cm^3$ or more and $1\times10^{21}/cm^3$ or less; a concentration of phosphorus in a surface overetched (a portion in contact with the wiring or the electrode 122) is about $4\times10^{20}/cm^3$; and a concentration of phosphorus in a region of which depth is deeper than 22 nm is lower than $4\times10^{20}/cm^3$.

Accordingly, it is considered that the high concentration impurity region 113b in a region having a concentration of phosphorus of $4\times10^{20}/cm^3$ or more and $1\times10^{21}/cm^3$ or less easily disappears by overetching in dry etching, while the high concentration impurity region 113b in a region having a concentration of phosphorus of lower than $4\times10^{20}/cm^3$, in particular, $1\times10^{20}/cm^3$ or less ($0/cm^3$ is a lower limit) is hardly overetched in dry etching.

In such a manner, depth of overetching can be controlled by controlling depth direction distribution of a concentration of an impurity element such as phosphorus contained in a semiconductor film.

A result by an experiment is shown, which is confirmed that an etching rate of a semiconductor film by dry etching is changed depending on a concentration of phosphorus in the semiconductor film and dose amount in a case of doping the semiconductor film with phosphorus. It is to be noted that small etching rate indicates that the semiconductor film is hardly etched.

A sample for performing dry etching is a film containing silicon as its main component, which is doped with phosphorus, formed over a substrate and a film containing silicon as its main component, which is not doped with phosphorus, formed over the substrate. A sample doped with phosphorus is subjected to heat treatment at 850° C. for 2 hours after doping in order to uniform concentration distribution of phosphorus in the film containing the silicon as its main component, in particular, in a depth direction. Doping of phosphorus is performed on conditions of three patterns in which only dose amount is different from each other. Each of the does amounts of the three patterns is $7\times10^{13}/cm^2$, $7\times10^{14}/cm^2$, and $7\times10^{15}/cm^2$. A concentration of phosphorus in the film containing silicon as its main component after heat treatment was measured by SIMS (a secondary ion mass spectrometry method). As a result, a concentration of phosphorus was about $1\times10^{19}/cm^3$ in a sample doped by the dose amount of $7\times10^{13}/cm^2$, about $1\times10^{20}/cm^3$ in a sample doped by dose amount of $7\times10^{14}/cm^2$, and about $1\times10^{21}/cm^3$ in a sample doped by does amount of $7\times10^{15}/cm^2$.

Dry etching using a mixed gas of helium and $CHF_3$ was performed for 2 minutes with respect to the sample to form a contact hole. Depth of the formed contact hole was about 10 nm in a sample that is not doped with phosphorus, about 17.4 nm in a sample that is doped with phosphorus by dose amount of $7\times10^{13}/cm^2$, about 20.9 nm in a sample that is doped with phosphorus by dose amount of $7\times10^{14}/cm^2$, and about 25.5 nm in a sample that is doped with phosphorus by dose amount of $7\times10^{15}/cm^2$. This result shows that an etching rate becomes smaller as a concentration of phosphorus in the film containing silicon as its main component becomes lower, and a sample that is not doped with phosphorus has the smallest etching rate.

As described above, an example of manufacturing a TFT is mentioned in this embodiment mode; however, an invention disclosed in the present specification can be applied to a semiconductor element other than the TFT. For example, an electric-field effect transistor using a silicon substrate can be manufactured. In this case, a base insulating film 112 and an island-shape film 113 containing silicon as its main component are not provided. In a case where a P-type silicon substrate is used as a substrate 111, the silicon substrate is doped with an impurity element imparting N-type conductivity to form a high concentration impurity region 113$b$ (a source region and a drain region). In addition, a low concentration impurity region 113$a$ may be formed in contact with the high concentration impurity region 113$b$. When the high concentration impurity region 113$b$ is formed, a concentration of an impurity element imparting N-type conductivity contained in a deeper region than predetermined depth of the high concentration impurity region 113$b$ is set to be $1\times10^{20}/cm^3$ or less.

Comparative Example

Figure 5A:
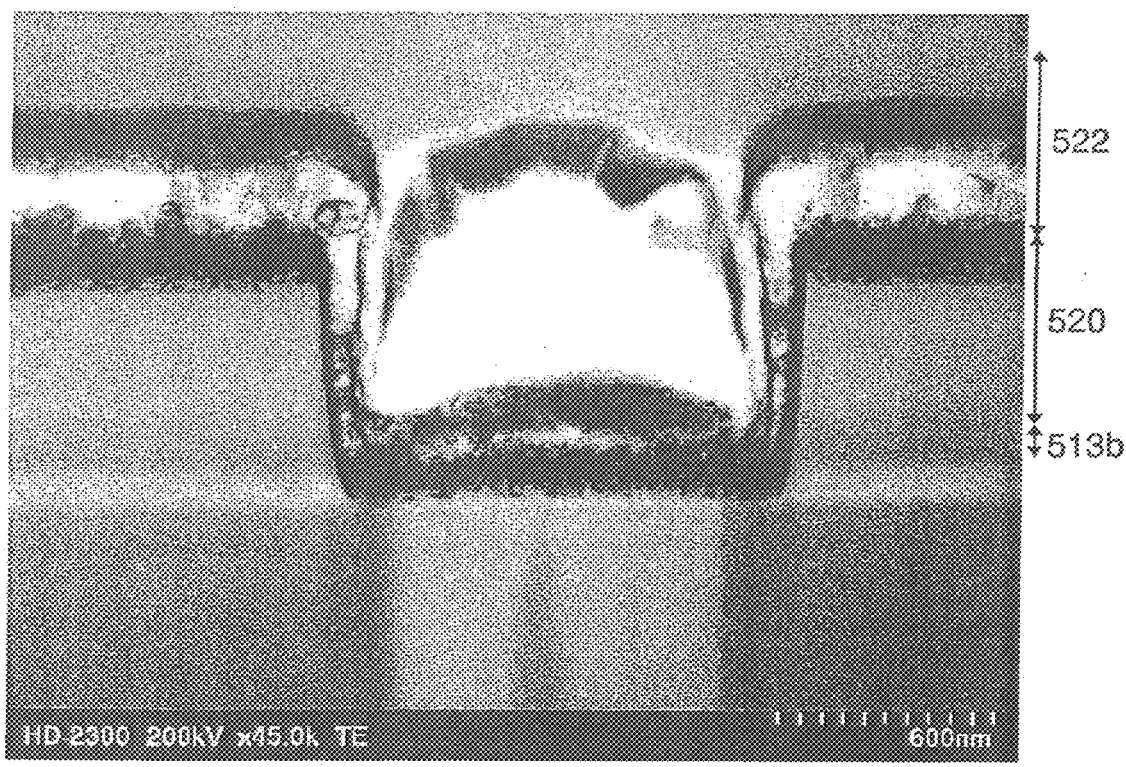
FIGS. 5A and 5B show a photograph of a cross-section of a contact portion and a graph for showing contact chain resistance.

A case of performing doping of phosphorus on the "condition B" in which an accelerating voltage described in Embodiment Mode 1 is 20 kV, is shown. FIG. 5A shows a photograph of a cross-section of a portion in which a high concentration impurity region 513$b$ where a film containing silicon as its main component is doped with phosphorus on the "condition B" and a wiring or an electrode 522 are connected through a contact hole in an interlayer insulating film 520, which is observed by an electron microscope. This comparative example has only one difference from Embodiment Mode 1 where doping of phosphorus is performed on the "condition B" instead of the "condition A" in which an accelerating voltage described in Embodiment Mode 1 is 10 kV.

The high concentration impurity region 513$b$ has an extremely thin thickness in a first region that is deeper than a portion in contact with the wiring or the electrode 522 due to excessive etching in forming the contact hole. The thickness of the first region is less than 50% of a film thickness before forming the contact hole. The high concentration impurity region 513$b$ has a thickness of about 60 nm in a second region except for the first region. Sheet resistance of the high concentration impurity region 513$b$ is 190 to 210$\Omega$/square, which is lower than the sheet resistance of the high concentration impurity region 113$b$ in Embodiment Mode 1. This result is due to a difference of concentration distribution of phosphorus.

Figure 5B:
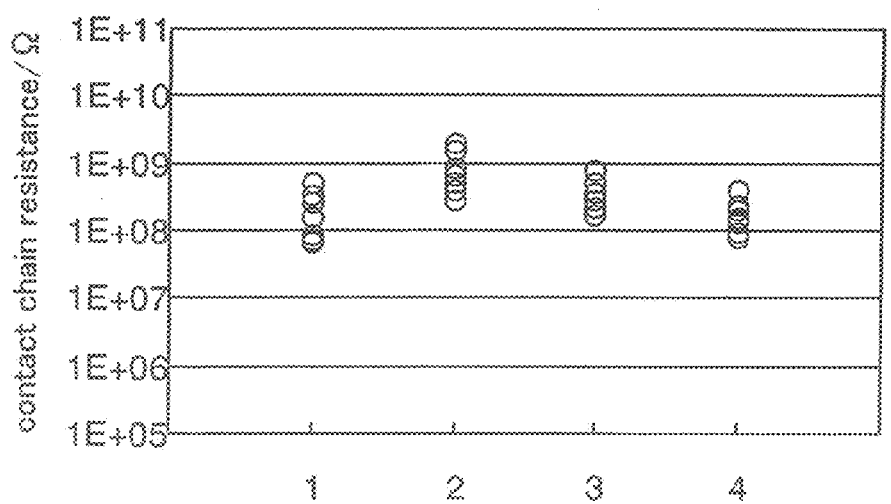

FIG. 5B shows a measurement result of contact chain resistance of an element that has a contact structure of the film containing silicon as its main component doped with phosphorus on the "condition B" and the wiring and the electrode 522. The contact chain resistance shown in FIG. 5B shows much higher value than that in FIG. 4B, and the contact chain resistance of FIG. 5B has large variation. This result intends that the "condition B" is inappropriate to be practical use even if the high concentration impurity region 513$b$ has an advantage of small sheet resistance as described above. In FIG. 5(B), a horizontal axis indicates substrates each having a contact chain, which are different from each other, and a vertical axis indicates measurement results of contact chain resistance in plural portions with respect to the contact chains each of which is formed over the substrates.

By referring to FIG. 2, concentration distribution of phosphorus contained in the high concentration impurity region 513$b$ shown in FIG. 5A is estimated as follows: a concentration of phosphorus in a region of which depth from a surface not overetched is up to 45 nm (a shallower region than depth of 45 nm) is more than $1\times10^{20}/cm^3$ to $1\times10^{21}/cm^3$ or less; and a concentration of phosphorus of a surface overetched (a portion in contact with the wiring or the electrode 522) is $1\times10^{20}/cm^3$ to $2\times10^{21}/cm^3$.

Accordingly, the high concentration impurity region 513$b$ in the region having a concentration of phosphorus of more than $1\times10^{20}$ to $1\times10^{21}/cm^3$ or less, easily disappears by overetching in dry etching. However, it is considered that the high concentration impurity region 513$b$ in the region having a concentration of phosphorus of $1\times10^{20}/cm^3$ or less (0/$cm^3$ is a lower limit), is hardly overetched in dry etching A result of this comparative example shows that, in a case where the film containing silicon as its main component doped with phosphorus on the "condition B" has a film thickness of 45 nm or less, the film has a high possibility to disappear by over etching. When the film disappears in such a manner, contact chain resistance becomes much larger than a value shown in FIG. 5B.

It is considered that a reason why depth of overetching in Embodiment Mode 1 and this comparative example are different from each other. There is only one difference of accelerating voltages in the case of doping of phosphorus in processes of Embodiment Mode 1 and this comparative example. However, due to a difference of the accelerating voltages, concentration distribution of phosphorus has a difference as shown in FIG. 2.

In Embodiment Mode 1, the high concentration impurity region 113$b$ has the largest concentration of phosphorus in the vicinity of depth of 10 nm. In the region that is deeper than depth of 10 nm, the concentration of phosphorus becomes lower. In a region that is in the vicinity of depth of 20 nm, the concentration of phosphorus becomes about $5\times10^{20}/cm^3$. In a region that is deeper than depth of 30 nm, the concentration of phosphorus becomes $1\times10^{20}/cm^3$ or less. In this case, as the region is deeper than 10 nm where the concentration of phosphorus is reduced, etching selectivity of the interlayer insulating film 120 and the high concentration impurity region 113$b$ becomes higher. In other words, since an etching rate of the high concentration impurity region 113$b$ becomes small, etching is suppressed. Accordingly, overetching of the high concentration impurity region 113$b$ is stopped at depth of about 22 nm.

On the other hand, in the case of this comparative example, the high concentration impurity region 513b has the largest concentration of phosphorus in the vicinity of depth of 20 nm. The concentration of phosphorus finally begins to become lower in a deeper region than depth of 20 nm; however, the concentration is reduced more gradually than the case of Embodiment Mode 1. Thus, etching selectivity of the interlayer insulating film 520 and the high concentration impurity region 513b is low differing from the case of Embodiment Mode 1, and etching of the high concentration impurity region 513b is not suppressed. Accordingly, a problem that the high concentration impurity region 513b is overetched to be further deeper than depth of 22 nm is caused.

Embodiment Mode 2

This embodiment mode shows an example of manufacturing a TFT by a different method from that of Embodiment Mode 1.

Doping for forming a high concentration impurity region (a source region and a drain region) in a region of a semiconductor film that is opened by a contact hole is performed not before forming the contact hole but after forming the contact hole. Consequently, etching selectivity of an interlayer insulating film and the semiconductor film becomes high, and etching can be easily stopped at an interface thereof. That is, in a case of forming the contact hole, the interlayer insulating film can be completely removed without overetching of the semiconductor film. A specific example is explained below.

Figure 6A:
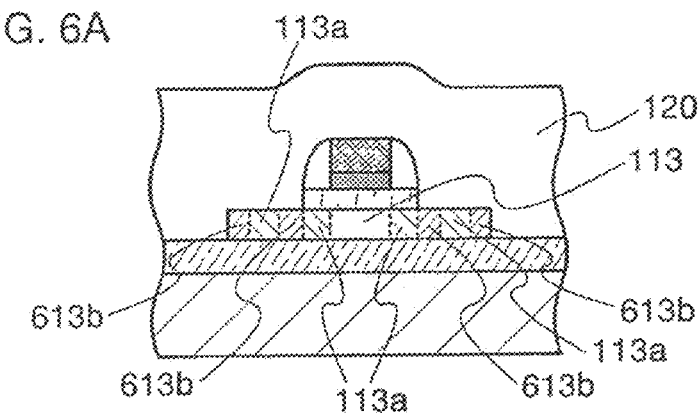
FIGS. 6A to 6D show cross-sectional views for showing a process of manufacturing a TFT.

In accordance with Embodiment Mode 1, the processes are performed, which are up to exposing part of the island-shape film 113 containing silicon as its main component (part of the low concentration impurity region 113a) as shown in FIG. 1C. Part of the exposed region, in other words, a region that is opened by a contact hole later, is covered with a mask such as a resist mask. Then, the island-shape film 113 containing silicon as its main component is doped with phosphorous on the "condition B" adopted in the comparative example to form a high concentration impurity region 613b (FIG. 6A). On the other hand, the high concentration impurity region 613b is not formed in the region covered with the mask such as a resist mask. In order to lower sheet resistance of the high concentration impurity region 613b, doping of phosphorus is performed on the "condition B". Doping may be performed on the "condition A" adopted in Embodiment Mode 1 instead of the "condition B". Thereafter, the used mask such as a resist mask is removed to form the interlayer insulating film 120 described in Embodiment Mode 1.

Figure 6B:
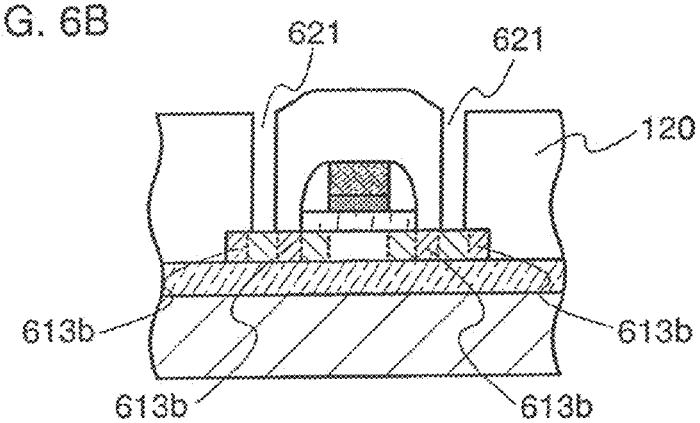

Dry etching is performed to the interlayer insulating film 120 to form a contact hole 621 (FIG. 6B). In this point, the high concentration impurity region 613b is not formed in a bottom surface of the contact hole 621. In this embodiment mode, dry etching is performed on the condition of high etching selectivity of the interlayer insulating film 120 and the island-shape film 113 containing silicon as its main component (the low concentration impurity region 113a). For example, a mixed gas of helium (He) and $CHF_3$ is used, and a mixed ratio is set to be $CHF_3/He$=56 sccm/144 sccm to perform dry etching with pressure of 7.5 Pa. The required time for the third step of "condition C" described in Embodiment Mode 1 may be shortened to perform dry etching without overetching of the island-shape film 113 containing silicon as its main component (the low concentration impurity region 113a). In a case where the contact hole 621 is formed to have a size for exposing all regions where the high concentration impurity region 613b shown in FIG. 6C is formed, the above process in which the region is covered with a mask such as a resist mask and doped with phosphorus is not needed.

Figure 6C:
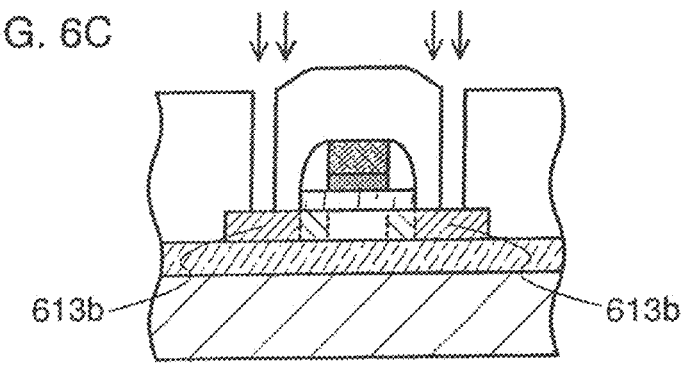

In addition, in order to form the high concentration impurity region 613b in the island-shape film 113 containing silicon as its main component (the low concentration impurity region 113a) through the contact hole 621, doping of phosphorus is performed on the "condition B" (FIG. 6C). Doping may be performed on the "condition A" instead of the "condition B". Thereafter, an impurity element subjected to doping is activated.

Figure 6D:
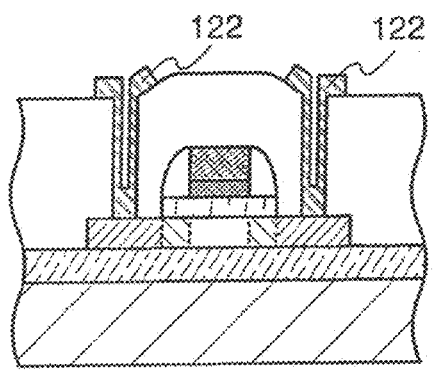

Then, a wiring or an electrode 122 described in Embodiment Mode 1 is fainted in the contact hole 621 (FIG. 6D).

In this embodiment mode, though the processes are complicated as compared to those of Embodiment Mode 1, doping of phosphorus can be performed on the "condition B". Therefore, sheet resistance of the high concentration impurity region 613b can be lowered, and the high concentration impurity region 613b is not overetched. However, in also this embodiment mode, the contact hole 621 may be formed so that the high concentration impurity region 613b is overetched as similarly to Embodiment Mode 1.

Embodiment 1

As a display device manufactured by using a TFT of an invention disclosed in the present specification, an example of a liquid crystal display device and an electroluminescence display device is shown. Hereinafter, an electroluminescence display device is referred to as an EL display device in the present specification.

Figure 7:
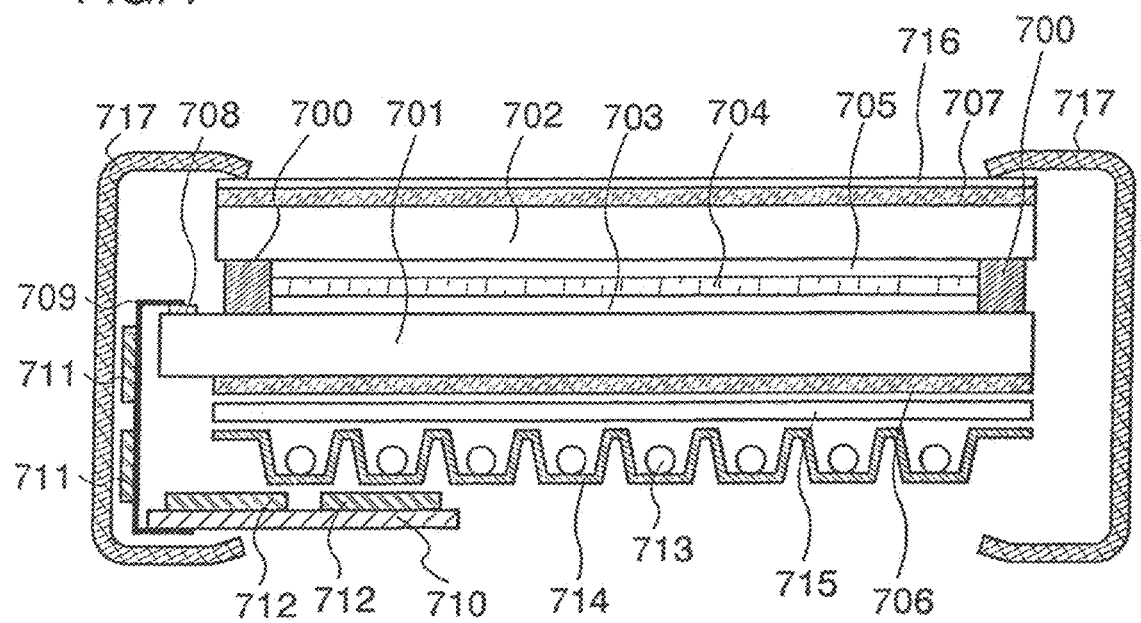
FIG. 7 shows a cross-sectional view for showing a liquid crystal display device.

FIG. 7 shows an example of a cross-section of a liquid crystal display device. A liquid crystal layer 704 is interposed between a first substrate 701 and a second substrate 702, and these substrates are bonded to each other with a sealing material 700. At least a pixel portion 703 is formed over the first substrate 701, and at least a coloring layer 705 is formed over the second substrate 702 by a printing method or the like. The coloring layer 705 is needed for color display. When using a RGB method, coloring layers corresponding to each color of red, green, and blue are provided corresponding to each pixel. Polarizing plates 706 and 707 are respectively provided on external sides of the first substrate 701 and the second substrate 702. Further, a protective film 716 is formed on a surface of the polarizing plate 707 to relieve impact from the outside.

A TFT that is a semiconductor element is formed corresponding to each pixel in the pixel portion 703, where a TFT of an invention disclosed in the present specification can be applied thereto. Thus, the TFT in each pixel normally operates without operation defects; therefore, defects of a display image such as a point defect and a line defect can be reduced.

A connecting terminal 708 provided over the first substrate 701 is connected to a wiring board 710 through an FPC 709. A driver circuit 711 (such as an IC chip) is provided over the FPC 709 or a connecting wiring, and external circuits 712 such as a control circuit and a power supply circuit are provided over the wiring board 710.

A cold-cathode tube 713, a reflector 714, and an optics film 715 are a backlight unit, which becomes a light source. The first substrate 701, the second substrate 702, the above light source, the wiring board 710, and the FPC 709 are held and protected by bezels 717.

Figure 8A:
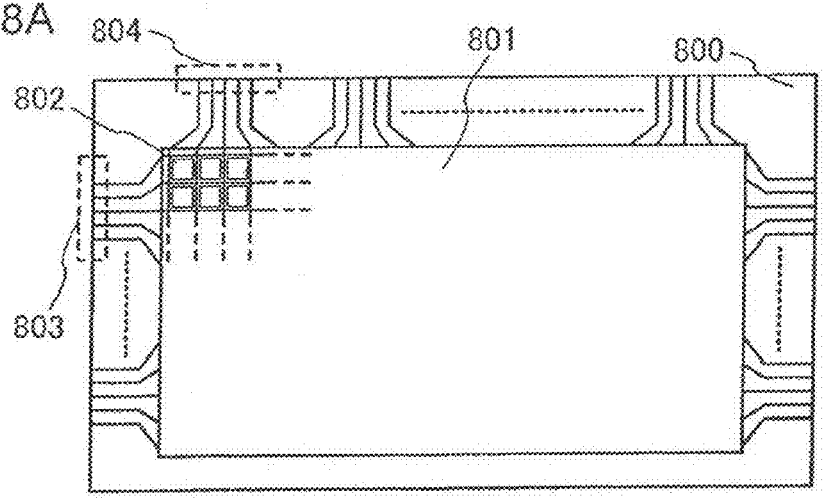
FIGS. 8A to 8C show schematic views from a top surface of a display device.
Figure 8B:
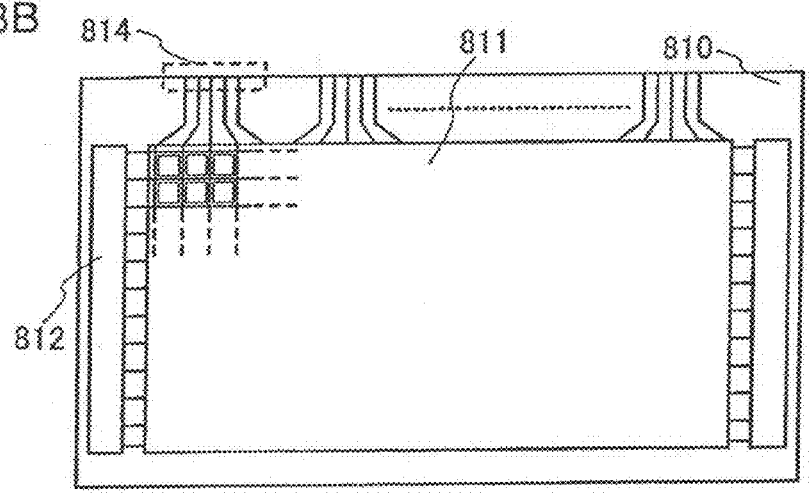
Figure 8C:
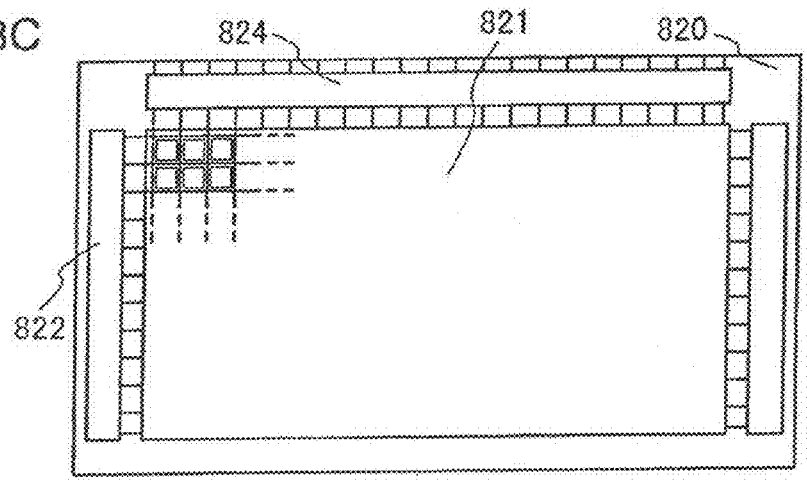

FIGS. 8A to 8C show schematic views of a display device such as a liquid crystal display device or an EL display device seen from a top.

In FIG. 8A, a pixel portion 801 in which a plurality of pixels 802 is arranged in matrix, a scanning line input terminal 803, and a signal line input terminal 804 are formed over a substrate 800. The pixels 802 are arranged in matrix by intersecting a scanning line extended from the scanning line input terminal 803 and a signal line extended from the signal line input terminal 804. Each of the plurality of pixels 802 is provided with a TFT that is a switching element and a pixel electrode. FIG. 8A shows an example in which a signal inputted into the scanning line and the signal line is controlled by a driver circuit connected to an external portion of the substrate through the scanning line input terminal 803 and the signal line input terminal 804. However, a COG method in which a driver circuit is formed over a substrate may be employed.

FIG. 8B shows an example in which a pixel portion 811 and a scanning line driver circuit 812 are formed over a substrate 810. Reference numeral 814 denotes a signal line input terminal similar to that of FIG. 8A. Further, FIG. 8C shows an example in which a pixel portion 821, a scanning line driver circuit 822, and a signal line driver circuit 824 are formed over a substrate 820.

The scanning line driver circuit 812 shown in FIG. 8B, the scanning line driver circuit 822, and the signal line driver circuit 824 shown in FIG. 8C are formed by TFTs and can be formed concurrently with TFTs provided in a pixel portion. However, since the scanning line driver circuit and the signal line driver circuit are required to have high-speed operation, a TFT in which a crystalline semiconductor film instead of an amorphous semiconductor film is used in a channel formation region may be adopted as TFTs used for these circuits.

A TFT of an invention disclosed in the present specification is adopted to the scanning line driver circuit 812 shown in FIG. 8B, the scanning line driver circuit 822 and the signal line driver circuit 824 shown in FIG. 8C as well as the pixel portions shown in FIGS. 8A, 8B, and 8C, whereby a yield can be improved.

Figure 9:
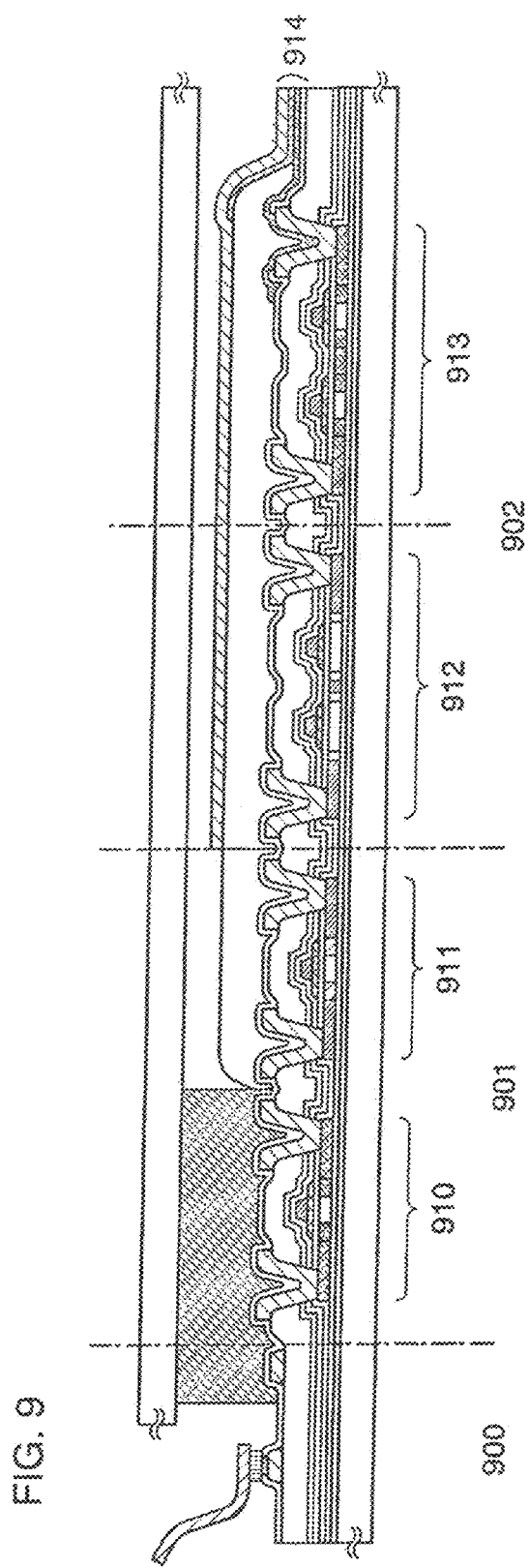
FIG. 9 shows a cross-sectional view for showing an electroluminescence display device.

FIG. 9 shows an example of a cross-section of an EL display device. This EL display device has a terminal portion 900, a driver circuit portion 901, and a pixel portion 902. The driver circuit portion 901 includes a P-channel TFT 910 and an N-channel TFT 911. The pixel portion 902 includes a switching TFT 912 and a driver TFT 913. The driver circuit portion 901 and the pixel portion 902 are formed over the same substrate.

FIG. 9 shows a so-called multi-gate structure as the switching TFT 912 and the driver TFT 913, of which purpose is to reduce an off-current of the TFT. For example, the switching TFT 912 can be made to be an N-channel TFT, and the driver TFT 913 can be made to be a P-channel TFT. A gate electrode of the switching TFT 912 is electrically connected to a scanning line. An electrode or a wiring, which is connected to a source region or a drain region of the switching TFT 912 through a contact hole, is electrically connected to a signal line.

An electrode or a wiring, which is connected to a source region or a drain region of the driver TFT 913 through a contact hole provided in an interlayer insulating film, is electrically connected to a light emitting element 914 in which an anode, a cathode, and a light emitting layer interposed therebetween are stacked. FIG. 9 shows a structure in which the electrode or the wiring is provided over the interlayer insulating film, another interlayer insulating film is provided thereover, and the light emitting element 914 is provided thereover. However, an invention of the present specification is not necessary to be limited to this structure. A transparent conductive film such as an ITO (Indium Tin Oxide) film can be used in one or both of the cathode and the anode of the light emitting element 914. The transparent conductive film is formed by a sputtering method or a printing method (a droplet discharging method such as inkjet, a screen printing method, or the like). A material for forming the transparent conductive film is not limited to the above ITO, and another material having a light transmitting property and conductivity may be used. By using the transparent conductive film in both of the cathode and the anode, light ejected from a light emitting layer can be emitted to an upward direction and a downward direction. Therefore, an image can be seen from the both directions of a top surface and a back surface of the EL display device.

A TFT of an invention disclosed in the present specification can be applied to the pixel portion 902. Consequently, defects of a display image such as a point defect and a line defect can be reduced similarly to the case of the liquid crystal display device. Further, by applying this TFT to the driver circuit portion 901 as well as the pixel portion 902, a yield can be improved.

A display device shown in this embodiment is mounted on various electronic devices. As examples of such electronic devices, TV sets, cameras (such as video cameras and digital cameras), navigation systems, audio reproducing devices (such as car audios and audio component sets), personal computers, game machines, portable information terminals (such as mobile computers, mobile phones, portable game machines, or electronic books), image reproducing devices provided with a recording medium (specifically, a device for reproducing the content of a recording medium such as a digital versatile disc (DVD) and provided with a display device for displaying the reproduced image), and the like can be given. The display device shown in this embodiment is mounted on a display portion or the like of these electronic devices.

Figure 10A:
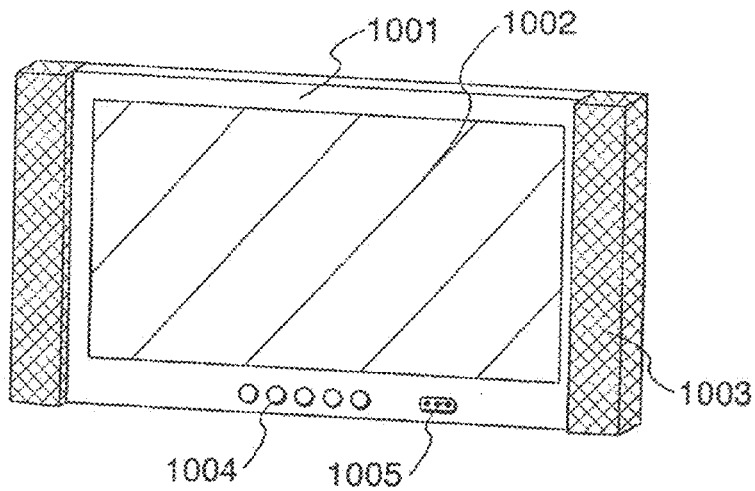
FIGS. 10A to 10D show views for showing electronic devices.

FIG. 10A shows an example of a TV set, which includes a chassis 1001, a display portion 1002, a speaker 1003, an operation portion 1004, a video input terminal 1005, and the like. A display device such as a liquid crystal display device or an EL display device, which is manufactured by using a TFT of an invention disclosed in the present specification, is applied to the display portion 1002.

Figure 10B:
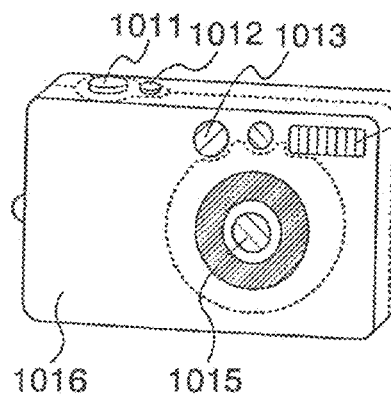
Figure 10C:
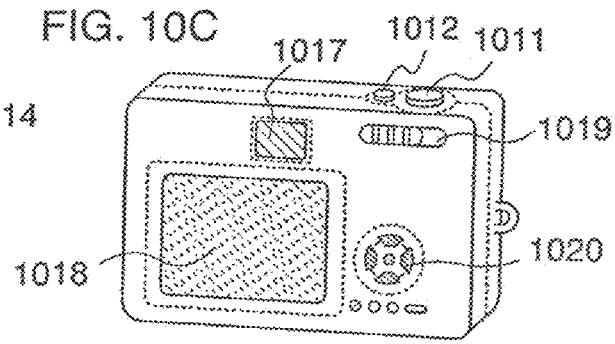

FIG. 10B and FIG. 10C show an example of a digital camera. FIG. 10B is a front view of the digital camera, and reference numeral 1011 denotes a release button; 1012, a main switch; 1013, a viewfinder; 1014, a stroboscope; 1015, a lens; and 1016, a chassis. FIG. 10C is a back view of the digital camera, and reference numeral 1017 denotes a viewfinder eyepiece window; 1018, a display portion; 1019, an operating button; and 1020, an operating button. A display device such as a liquid crystal display device or an EL display device, which is manufactured by using a TFT of the invention disclosed in the present specification, is applied to the display portion 1018.

Figure 10D:
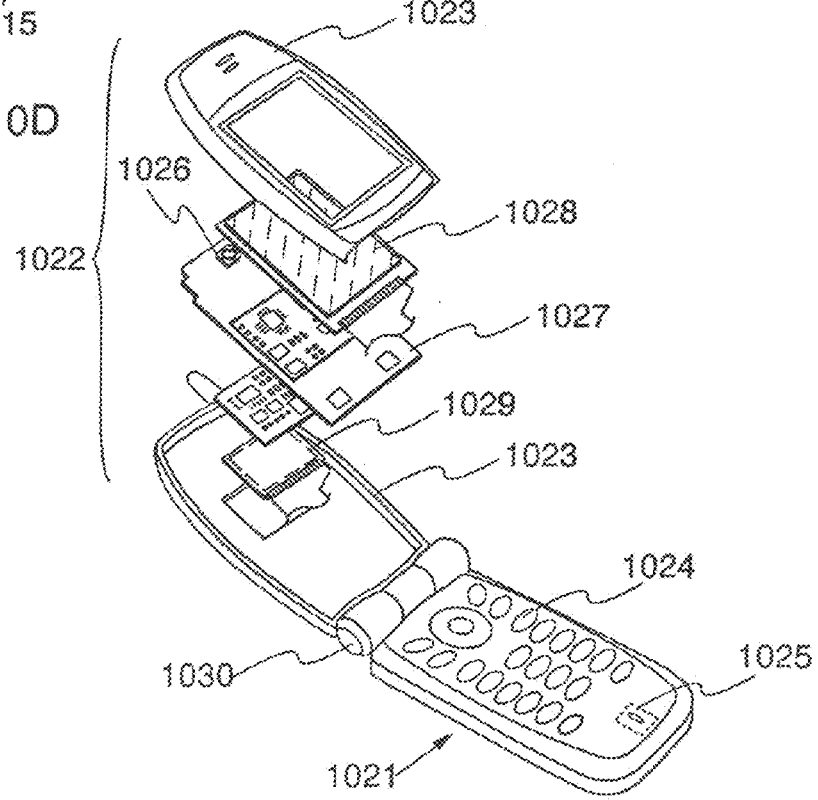

FIG. 10D shows an example of a mobile phone, which includes a main body (A) 1021 provided with operation switches 1024, a microphone 1025, and the like, and a main body (B) 1022 provided with a display panel (A) 1028, a display panel (B) 1029, a speaker 1026, and the like. The main body (A) 1021 and the main body (B) 1022 are connected with a hinge 1030 so that the mobile phone can be opened or folded. The display panel (A) 1028 and the display panel (B) 1029 are incorporated into a chassis 1023 of the main body (B) 1022 together with a circuit substrate 1027. Pixel portions of the display panel (A) 1028 and the display panel (B) 1029 are arranged so as to be seen from an open window formed in the chassis 1023. A display device such as a liquid crystal display device or an EL display device, which is manufactured by using a TFT of an invention disclosed in the present specification, is applied to the display panel (A) 1028 and the display panel (B) 1029.

The specifications of the display panel (A) 1028 and the display panel (B) 1029 such as the number of pixels can be appropriately set in accordance with a function of this mobile phone. For example, the display panel (A) 1028 and the display panel (B) 1029 can be used in combination so as to be used as a main display screen and a sub-display screen, respectively.

By using such a display panel, the display panel (A) 1028 can be a high-definition color display screen displaying characters and an image, and the display panel (B) 1029 can be a unicolor information display screen displaying character information. Especially, by making the display panel (B) 1029 an active matrix type and having high-definition, a variety of character information can be displayed and an information display density per one screen can be improved. For example, the display panel (A) 1028 can be set with 2 to 2.5 inches, 64 grayscales, and 260,000 colors QVGA (320 dots×240 dots), and the display panel (B) 1029 can be set as a high-definition panel with 180 to 220 ppi, and unicolor from 2 to 8 grayscales, so as to display alphabets, hiragana, katakana, numeric characters, Chinese characters, and the like.

The mobile phone of this embodiment can be changed into various modes in accordance with the function or applications. For example, by incorporating an imaging element into the hinge 1030, a mobile phone equipped with a camera may be provided. In addition, the mobile phone may have a structure in which the operation switches 1024, the display panel (A) 1028, and the display panel (B) 1029 are incorporated into one chassis.

This embodiment can be implemented by combining with Embodiment Mode 1 and Embodiment Mode 2.

Embodiment 2

A transistor of an invention disclosed in the present specification can be used for a semiconductor device such as an integrated circuit device or a non-contact integrated circuit device (it may be referred to as a wireless IC tag or an RFID (Radio Frequency Identification) tag). By attaching the non-contact integrated circuit device (hereinafter, referred to as a wireless IC tag in the present specification) to various electronic devices as shown in Embodiment 1, a distribution channel or the like of the electronic device can be made to be clear.

Figure 11A:
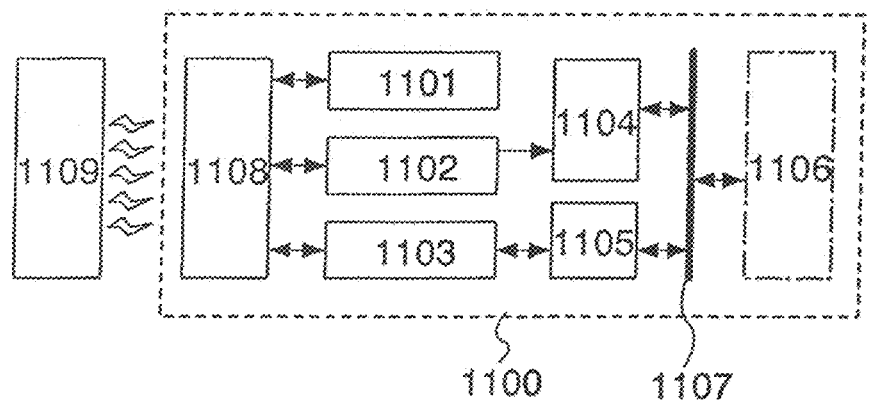
FIGS. 11A and 11B show block diagrams for showing a wireless IC tag.
Figure 11B:
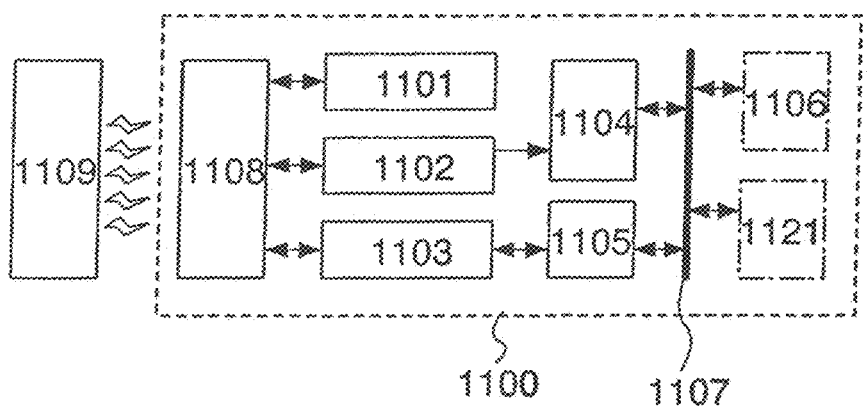
Figure 12A:
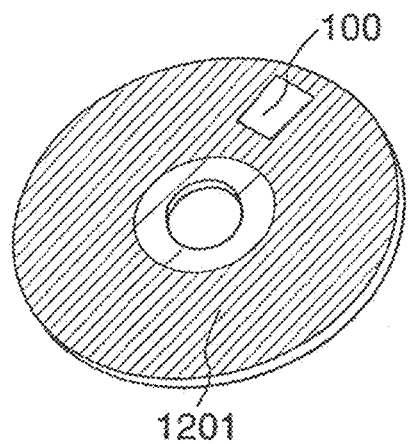
FIGS. 12A to 12E show examples of usage of a wireless IC tag.
Figure 12B:
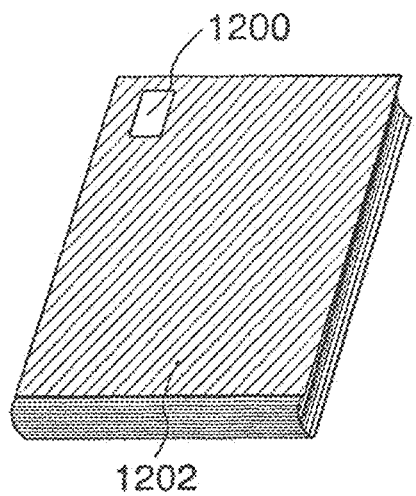
Figure 12C:
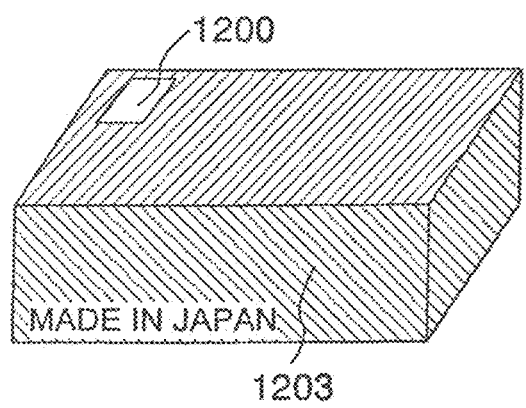
Figure 12D:
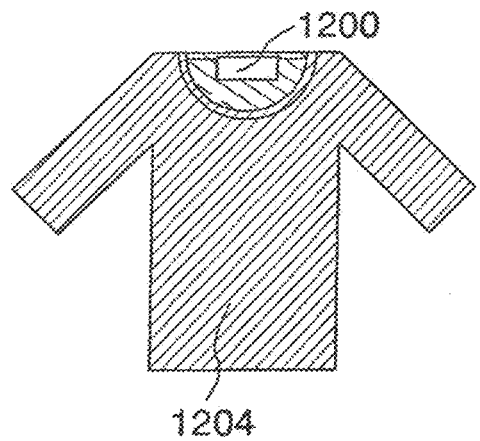
Figure 12E:
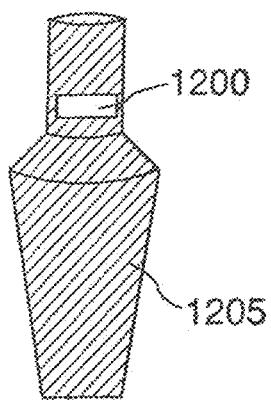

FIG. 11A and FIG. 11B show block diagrams of an example of a wireless IC tag. A wireless IC tag 1100 can communicate data wirelessly, which includes a power supply circuit 1101, a clock generation circuit 1102, a data demodulation/modulation circuit 1103, a control circuit 1104, an interface circuit 1105, a memory circuit 1106, a bus 1107, and an antenna 1108. FIG. 11B shows a wireless IC tag provided with an CPU 1121 in addition to content of the wireless IC tag of FIG. 11A.

The power supply circuit 1101 generates electric power supply based on an alternating current signal inputted from the antenna 1108. The clock generation circuit 1102 generates a clock signal based on a signal inputted from the antenna 1108. The data demodulation/modulation circuit 1103 demodulates/modulates data to be communicated with a reader/writer 1109. The antenna 1108 receives a signal and transmits data.

As a material forming the antenna 1108, for example, gold, silver, copper, aluminum, ferrite, or ceramics can be used. As a shape of the antenna 1108, for example, a dipole shape, an annular loop shape, a spiral shape, or a flat rectangular-patch shape can be used.

A circuit forming the wireless IC tag 1100 can be manufactured by using a transistor of an invention disclosed in the present specification. The antenna 1108 is provided to be electrically connected to the transistor. The antenna 1108 can be manufactured together with the transistor over a substrate by a combination of a sputtering method or a CVD method and a photolithography process, a screen printing method in which a photolithography process is unnecessary, a droplet discharging method, or the like. Alternatively, a ready-made component as the antenna 1108 and a substrate over which a transistor is formed are bonded to each other with a conductive paste or the like so that the antenna 1108 can be electrically connected to the transistor.

As the memory circuit 1106, a DRAM, an SRAM, a mask ROM, an EPROM (Erasable Programmable Read Only Memory), an EEPROM (Electrically Erasable Programmable Read Only Memory), a flash memory, an organic memory, or the like can be used. An organic memory has a structure in which an organic compound layer is provided between a pair of electrodes, or a structure in which a layer having an organic compound or an inorganic compound is provided between a pair of electrodes. The organic memory contributes to the wireless IC tag in which a small, thin shape, and lightweight are realized by being applied to the memory circuit 1106 of the wireless IC tag.

Since a manufacturing cost of a wireless IC tag is higher than that of the conventional barcode, cost reduction is needed. By manufacturing a wireless IC tag by using an invention disclosed in the present specification, a yield is improved, and then, a wireless IC tag, which has high-quality and small variation of performance, can be provided at low cost.

FIGS. 12A to 12E show usage examples of a wireless IC tag. The wireless IC tag can be attached to a recording medium 1201 itself in which information is recorded or a case in which the recording medium 1201 is placed, a document 1202, a package 1203 of articles, a garment 1204, or goods such as a glass or plastic bottle 1205, whereby the wireless IC tag can be used for application of sales, stock, management of rental and return, prevention of loss or theft, collection, and the like. In each view of FIGS. 12A to 12E, an example of an attachment position 1200 of the wireless IC tag is shown.

This embodiment can be implemented by combining with Embodiment Mode 1, Embodiment Mode 2, and Embodiment 1.

This application is based on Japanese Patent Application serial no. 2005-241734 filed in Japan Patent Office on Aug. 23 in 2005, the entire contents of which are hereby incorporated by reference.

What is claimed is:

1. A method of manufacturing a semiconductor device, comprising:
   forming a first insulating film over a semiconductor film;
   forming a gate electrode over the first insulating film;
   forming a second insulating film over the first insulating film and the gate electrode;
   doping the semiconductor film with a first impurity element through the first insulating film;
   etching a part of the first insulating film so as to expose a part of the semiconductor film;
   doping the semiconductor film with a second impurity element, so as to dope a first portion of the semiconductor film and so as not to dope a second portion of the semiconductor film, wherein the first portion is adjacent to the second portion;

forming an interlayer insulating film over the gate electrode;

forming a contact hole reaching the second portion of the semiconductor film in the interlayer insulating film by etching a part of the interlayer insulating film; and doping the second portion of the semiconductor film with the second impurity element through the contact hole, so that a concentration of the second impurity element in the second portion approaches to a concentration of the second impurity element in the first portion, wherein a part of the second insulating film is etched together with the part of the first insulating film on etching the part of the first insulating film, so as to form a side wall in contact with the gate electrode.

2. A method of manufacturing a semiconductor device according to claim 1, wherein a portion of the semiconductor film is located in upper half of the semiconductor film, wherein a concentration of the second impurity element at the portion of the semiconductor film is $1 \times 10^{20}/cm^3$.

3. A method of manufacturing a semiconductor device according to claim 1, wherein the semiconductor film has a thickness of less than 45 nm.

4. A method of manufacturing a semiconductor device according to claim 1, wherein accelerating voltage for doping with the second impurity element is less than 10 kV.

5. A method of manufacturing a semiconductor device according to claim 1, wherein a gas used for forming the contact hole consists of one of $CHF_4$, $CF_4$, $CHF_4$ with noble gas, and $CF_4$ with noble gas.

6. A method of manufacturing a semiconductor device according to claim 1, wherein a peak concentration of the second impurity element in the semiconductor film is located in the upper half of the semiconductor film.

7. A method of manufacturing a semiconductor device according to claim 1, further comprising:
forming a source electrode and a drain electrode which are electrically connected to the semiconductor film, so as to fill only a part of the contact hole.

8. A method of manufacturing a semiconductor device according to claim 1, wherein a conductivity type of the first impurity element is a same as a conductivity type of the second impurity element.

9. A method of manufacturing a semiconductor device according to claim 1,
wherein the semiconductor film is formed by patterning a semiconductor layer to have an island shape, and
wherein the first insulating film is formed so as to be in contact with a side surface of the semiconductor film.

10. A method of manufacturing a semiconductor device, comprising:
forming a first insulating film over a semiconductor film;
forming a gate electrode over the first insulating film;
forming a second insulating film over the first insulating film and the gate electrode;
doping the semiconductor film with a first impurity element through the first insulating film;
etching a part of the first insulating film so as to expose a part of the semiconductor film;
doping the semiconductor film with a second impurity element, so as to dope a first portion of the semiconductor film and so as not to dope a second portion of the semiconductor film, wherein the first portion is adjacent to the second portion;
forming an interlayer insulating film over the gate electrode;
forming a contact hole reaching the second portion of the semiconductor film in the interlayer insulating film by etching a part of the interlayer insulating film; and
doping the second portion of the semiconductor film with the second impurity element through the contact hole, so that a concentration of the second impurity element in the second portion approaches to a concentration of the second impurity element in the first portion,
wherein a part of the second insulating film is etched together with the part of the first insulating film on etching the part of the first insulating film, so as to form a side wall in contact with the gate electrode, and
wherein the semiconductor film comprises amorphous semiconductor.

11. A method of manufacturing a semiconductor device according to claim 10, wherein a portion of the semiconductor film is located in upper half of the semiconductor film, wherein a concentration of the second impurity element at the portion of the semiconductor film is $1 \times 10^{20}/cm^3$.

12. A method of manufacturing a semiconductor device according to claim 10, wherein the semiconductor film has a thickness of less than 45 nm.

13. A method of manufacturing a semiconductor device according to claim 10, wherein accelerating voltage for doping with the second impurity element is less than 10 kV.

14. A method of manufacturing a semiconductor device according to claim 10, wherein a gas used for forming the contact hole consists of one of $CHF_4$, $CF_4$, $CHF_4$ with noble gas, and $CF_4$ with noble gas.

15. A method of manufacturing a semiconductor device according to claim 10, wherein a peak concentration of the second impurity element in the semiconductor film is located in the upper half of the semiconductor film.

16. A method of manufacturing a semiconductor device according to claim 10, further comprising:
forming a source electrode and a drain electrode which are electrically connected to the semiconductor film, so as to fill only a part of the contact hole.

17. A method of manufacturing a semiconductor device according to claim 10, wherein a conductivity type of the first impurity element is a same as a conductivity type of the second impurity element.

18. A method of manufacturing a semiconductor device according to claim 10,
wherein the semiconductor film is formed by patterning a semiconductor layer to have an island shape, and
wherein the first insulating film is formed so as to be in contact with a side surface of the semiconductor film.

19. A method of manufacturing a semiconductor device according to claim 1, wherein the semiconductor film is a polycrystalline semiconductor film.

20. A method of manufacturing a semiconductor device according to claim 1, wherein the semiconductor film is a single crystal semiconductor film.

21. A method of manufacturing a semiconductor device according to claim 10, wherein the semiconductor film is a polycrystalline semiconductor film.

22. A method of manufacturing a semiconductor device according to claim 10, wherein the semiconductor film is a single crystal semiconductor film.

23. A method of manufacturing a semiconductor device, comprising:
forming a first insulating film over a single crystal semiconductor film;
forming a gate electrode over the first insulating film;

forming a second insulating film over the first insulating film and the gate electrode;

doping the single crystal semiconductor film with an impurity element, so as to dope a first portion of the single crystal semiconductor film and so as not to dope a second portion of the single crystal semiconductor film, wherein the first portion is adjacent to the second portion;

etching a part of the first insulating film so as to expose a part of the single crystal semiconductor film;

forming an interlayer insulating film over the gate electrode;

forming a contact hole reaching the second portion of the single crystal semiconductor film in the interlayer insulating film by etching a part of the interlayer insulating film; and doping the second portion of the single crystal semiconductor film with the impurity element, wherein a part of the second insulating film is etched together with the part of the first insulating film on etching the part of the first insulating film, so as to form a side wall in contact with the gate electrode.

24. A method of manufacturing a semiconductor device according to claim 23, wherein a portion of the single crystal semiconductor film is located in upper half of the single crystal semiconductor film, wherein a concentration of the impurity element at the portion of the single crystal semiconductor film is $1 \times 10^{20}/cm^3$.

25. A method of manufacturing a semiconductor device according to claim 23, wherein the single crystal semiconductor film has a thickness of less than 45 nm.

26. A method of manufacturing a semiconductor device according to claim 23, wherein a peak concentration of the second impurity element in the single crystal semiconductor film is located in the upper half of the single crystal semiconductor film.

* * * * *